United States Patent [19]

Van Antwerp

[11] Patent Number: 4,514,727
[45] Date of Patent: Apr. 30, 1985

[54] AUTOMATIC BRIGHTNESS CONTROL APPARATUS

[75] Inventor: Joel C. Van Antwerp, Frisco, Tex.

[73] Assignee: TRW Inc., Redondo Beach, Calif.

[21] Appl. No.: 392,675

[22] Filed: Jun. 28, 1982

[51] Int. Cl.³ .............................................. G09G 3/00
[52] U.S. Cl. .................... 340/793; 358/161; 250/214 AL; 340/812
[58] Field of Search ............... 340/793, 703, 812, 791, 340/753, 754; 358/161; 250/214 B, 214 AL, 214 C

[56] References Cited

U.S. PATENT DOCUMENTS

| | | | |
|---|---|---|---|
| 3,493,956 | 2/1970 | Andrews et al. | 340/792 |
| 3,889,251 | 6/1975 | Litman | 250/214 AL |
| 4,009,414 | 2/1977 | Bockett-Pugh | 340/753 |
| 4,346,331 | 8/1982 | Hoge | 250/214 AL |
| 4,368,406 | 1/1983 | Kruzich et al. | 250/214 AL |
| 4,386,345 | 5/1983 | Narveson et al. | 340/703 |

FOREIGN PATENT DOCUMENTS 2434049  3/1980  France ................... 340/793

*Primary Examiner*—Marshall M. Curtis
*Attorney, Agent, or Firm*—Jack A. Kanz; Robert J. Stern

[57] ABSTRACT

Automatic brightness control apparatus for providing real time control of the brightness of various types of displays while also providing ambient light compensation is disclosed which includes a photodiode for providing a current proportional to the ambient light level. Amplifiers, together with a load, change the photodiode current to a control voltage indicating the level of ambient light. The control voltage is provided as a reference input to a voltage comparator. The other input to the voltage comparator is the output of a free running ramp oscillator. The pulse width modulated logic signal comprising the output of the voltage comparator is provided as the input for an output driver whose pulse stream output is used to control the brightness of the designated display. The duty cycle of the pulse stream output varies with the ambient light level. Several logic gates are added to the free running ramp oscillator to provide synchronization capability and assure that the ramp output waveform of the ramp oscillator will always begin with an incoming synch pulse. The automatic brightness control apparatus is packaged as a monolithic integrated circuit on a single silicon chip which is housed in a clear plastic 8 pin DIP.

5 Claims, 6 Drawing Figures

AUTOMATIC BRIGHTNESS CONTROL APPARATUS

DESCRIPTION

1. Technical Field

The present invention relates in general to display systems, and more particularly to apparatus for providing dynamic brightness control of display systems.

Although the present invention is applicable for providing automatic brightness control for various displays, it has been found to be particularly useful in providing automatic brightness control for various multiple function displays located across the instrument panel of an automobile. Therefore, without limiting the applicability of the invention to "automobile displays," the invention will be described in this environment.

Sophisticated electronic displays represent a growing trend in panel instrumentation for U.S. automobiles. One location, single function displays, such as a digital clock, a radio, or an instrument cluster, are giving way to multiple function displays located across the instrument panel. In the 1980 model year, one automobile corporation introduced an all electronic instrument panel. In the 1981 model year, another automobile corporation introduced an electronic instrument cluster which included four digital displays for chronometer, odometer, speedometer and fuel supply functions. Currently, vacuum fluorescent displays seem to offer the greatest flexibility for automobile display strategies. However, other technologies, such as CRTs and LCDs, are emerging which could have a very dramatic impact on automobile display design.

2. Background Art

The large dynamic range of light levels occurring in vehicles and its effect upon the visibility, by the operator, of various displays located across the instrument panel established a need for some type of real time light controlling system for the various displays. Specifically, controlling display intensity, once not considered a critical function, becomes critical as automobile manufacturers strive to make the various displays more pleasing to the consumer.

The effect of ambient light on display intensity has always been a design consideration, which was normally addressed by one or more of the following techniques: (1) arbitrarily selecting a brightness level for the display with the selected brightness level being controlled by discrete components, (2) providing a step function for the display intensity which is mechanically tied to the interaction of a second function, such as the engagement of the headlight switch, or (3) a dynamic brightness control system which is regulated by discrete components and/or computer software. Selecting a specific technique was normally tied to the most cost effective approach for each display function. As long as single function displays, such as a digital clock, radio or instrument cluster, were controlled separately, then there were no problems. As the individual functions were combined into more complex systems, it was found that the methods used for individual displays would not necessarily work in an integrated display system without costly system interfaces or varying degrees of display intensity. Thus, there was a need for some type of real-time control subsystem which would include techniques for ambient light compensation but which would maintain the reliability and cost objectives needed as a basis for system brightness control.

The present invention as claimed is intended to provide a solution to various prior art deficiencies including the inability of the prior art methods and devices to automatically provide real time light control of the various displays in a cost effective manner. Also, the prior art devices did not provide effective light control of the various displays over the large dynamic range of light levels to which the displays in the instrument panel were subjected. In addition, the prior art devices did not provide effective light control of the broad types of displays including fluorescent displays, CRT displays, LCD displays, etc. The prior art devices did not provide for external sensitivity adjustment for the brightness control.

DISCLOSURE OF THE INVENTION

The present invention provides automatic brightness control apparatus for automatically controlling the brightness of the various displays in the instrument panel of an automobile by automatically adjusting for changes in ambient light to make the display appear to remain at the same brightness level. The automatic brightness control apparatus includes a photodiode which together with appropriate amplifiers and load resistor provide a control voltage which provides an indication of the relative light level surrounding the displays. The control voltage is applied as the reference input to a voltage comparator. A free running ramp oscillator provides a ramp voltage waveform output whose peak values are predetermined but whose peak to peak voltage will decrease if the primary power supply voltage decreases. The ramp voltage waveform of the free running ramp oscillator is applied as the other input to the voltage comparator. The output of the voltage comparator is a logic signal which is pulse width modulated and is used to control the brightness of the display. If the power supply voltage decreases, the peak to peak ramp voltage will drop but the duty cycle of the pulse width modulated output will increase. Various logic gates in conjunction with the ramp generating circuit provide the ability to synchronize the automatic brightness control apparatus with a display driver so the ramp waveform will always begin with an incoming sync pulse. The automatic brightness control apparatus 10 is implemented as a monolithic integrated circuit on a single silicon chip housed in a clear plastic eight (8) pin DIP.

Among the advantages offered by the present invention is the ability to automatically provide real time light control of the various displays while also providing ambient light compensation. The present invention allows this control to be done in a cost effective manner. The present invention compensates for changes in the power supply voltage for the display. Also, the present invention allows synchronization with a display driver. If several drivers are used and multiplexed, they can all be controlled by a single automatic brightness control apparatus. Furthermore, the present invention provides external sensitivity adjustment, analog and digital output and synchronous or asynchronous modes of operation.

Examples of the more important features of this invention have thus been summarized rather broadly in order that the detailed description thereof that follows may be better understood, and in order that the contribution to the art may be better appreciated. There are, of course, additional features of the invention that will be described hereinafter and which will also form the subject of the claims appended hereto. Other features of the present invention will become apparent with reference to the following detailed description of a presently preferred embodiment thereof in connection with the accompanying drawing, wherein like reference numerals have been applied to like elements, in which:

BEST MODE FOR CARRYING OUT THE INVENTION

Figure 1:
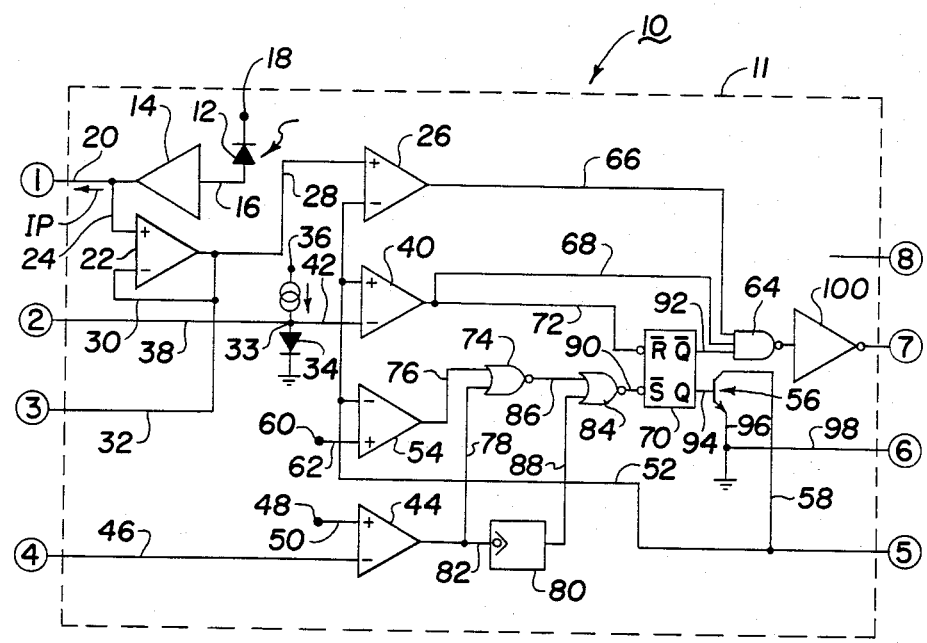
FIG. 1 is a simplified block circuit diagram illustrating the overall system of the present invention.

Referring now to the drawing, and in particular to FIG. 1, automatic brightness control apparatus according to the present invention is generally referred to by reference numeral 10. The automatic brightness control apparatus 10 is implemented as a monolithic integrated circuit on a single silicon chip housed in a clear plastic eight (8) pin DIP 11 and comprises photodiode 12 whose anode is connected to the input of current amplifier 14 by lead 16. The cathode of photodiode 12 is connected to voltage source $V_B$ at terminal 18. In the preferred embodiment, photodiode 12 is a PN junction diode with active area of 0.016 cm², current amplifier 14 is a high gain temperature-compensated current amplifier and $V_B$ is in the range of 1.2 to 1.5 volts. The $I_p$ output of current amplifier 14 is the amplified photocurrent of photodiode 12 and is sourced out of PIN 1 from an open-collector PNP current source of current amplifier 14 via lead 20. $I_p$ is typically 1 to 2 ma under normal light conditions. $I_p$ is also provided as an input to the positive input terminal of operational amplifier 22 via lead 24. The output of operational amplifier 22 goes to the positive input terminal of first comparator 26 via lead 28, to the negative input terminal of operational amplifier 22 via lead 30 as a feedback signal and to PIN 3 of DIP 11 via lead 32. Reference voltage $V_R$ at terminal 33 is set by the approximately 150 microamp current source connected to $V_{CC}$ at terminal 36 driving diode 34 whose cathode is connected to ground. In the preferred embodiment, $V_{CC}$ is approximately 12-14 volts DC (the battery voltage) and $V_R$ is approximately 680 millivolts. $V_{CC}$ operating range is 4.5 to 24 volts. Reference voltage $V_R$ is provided to PIN 2 of DIP 11 via lead 38 and to the negative input terminal of the second comparator 40 via lead 42. PIN 4 of DIP 11 is connected to the negative input terminal of the fourth comparator 44 via lead 46. The positive input terminal of the fourth comparator 44 is connected to terminal 48 via lead 50 with a voltage of approximately ½ $V_{CC}-V_R$ being applied to terminal 48.

PIN 5 of DIP 11 is connected via lead 52 to the negative input terminal of third comparator 54, to the positive input terminal of second comparator 40 and to the negative input terminal of first comparator 26. PIN 5 of DIP 11 is also connected to the collector terminal of NPN transistor 56 via lead 58. The positive input terminal of third comparator 54 is connected to terminal 60 via lead 62. A voltage equal to one-half of $V_{CC}$ is applied to terminal 60.

The output of first comparator 26 provides a first input to NAND gate 64 via lead 66. The output of second comparator 40 provides a second input to NAND gate 64 via lead 68 and also an input to the $\overline{R}$ input terminal of $\overline{R}\,\overline{S}$ latch 70 via lead 72. The output of third comparator 54 provides one input to NOR gate 74 via lead 76. The output of the fourth comparator 44 is provided as the other input to NOR gate 74 via lead 78 and also as the input to one-shot multivibrator 80 via lead 82. The output of NOR gate 74 is provided as one input to NOR gate 84 via lead 86 with the other input to NOR gate 84 being the output of the one-shot multivibrator 80 via lead 88. The output of NOR gate 84 is provided as an input to the $\overline{S}$ input terminal of $\overline{R}\,\overline{S}$ latch 70 via lead 90. The $\overline{Q}$ output of $\overline{R}\,\overline{R}$ latch 70 provides the third and final input to NAND gate 64 via lead 92 while the Q output of $\overline{R}\,\overline{S}$ latch 70 provides the input to the base terminal of NPN transistor 56 via lead 94. The emitter terminal of NPN transistor 56 is connected to ground via lead 96. PIN 6 of DIP 11 is connected to ground via lead 98. The output of NAND gate 64 is provided as an input to output driver 100 whose output is provided to PIN 7 of DIP 11. The output of output driver 100 is the output of the automatic brightness control apparatus 10 which is used in the adjustment of the brightness of various displays. $V_{CC}$ is applied to PIN 8 of DIP 11.

Figure 2:
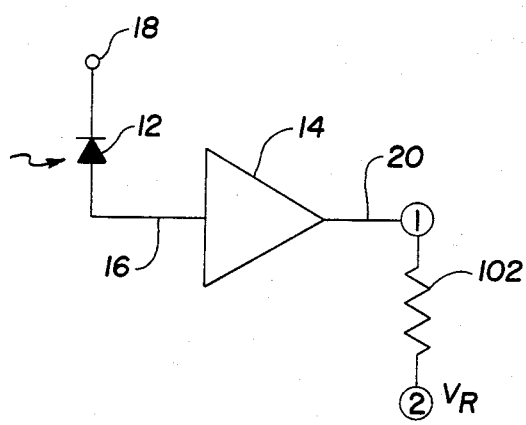
FIG. 2 is a simplified schematic diagram for generating a voltage to set the sensitivity level of the system.

To implement the present invention for dynamic brightness control to perform the control function over a typical range of ambient light variances, the monolithic integrated circuit was developed to incorporate automatic brightness control for various display technologies. The overall performance characteristics of the inventive circuit can best be achieved by reviewing the circuit function and analyzing each section individually. Photodiode 12 is a PN junction diode with an active area of 0.016 cm² integrated into the monolithic chip. The starting material and processing used typically yields a responsivity of 0.35 amps per watt. If we have incident light extremes of 0.1 mw/cm² to 100 mw/cm², the following formula can be used to approximate the minimum/maximum current $I_B$ of the photodiode 12: $I_B = (E_e)(R)(A)$, where $E_e$ = incident light level, R = responsivity and A = diode active area. By using the above formula, the dynamic range of the photodiode current $I_B$ is from 0.56 microamps to 560 microamps. The current $I_B$ from the photodiode 12 is amplified by current amplifier 14. In the preferred embodiment, current amplifier 14 has a gain of 500. The output of the current amplifier 14 is connected to an external load resistor 102 positioned at PIN 1 of DIP 11. Load resistor 102 is used to convert the amplified current $I_B$ of photodiode 12 to a voltage and set the sensitivity level of the system. This portion of the system is shown schematically at FIG. 2.

The voltage developed across load resistor 102 of current amplifier 14 and appearing at PIN 1 of DIP 11 is fed to operational amplifier 22 via lead 24. In the preferred embodiment, operational amplifier 22 has unity gain. The output of operational amplifier 22, appearing on leads 28 and 32, now serves as the control voltage $V_C$ and is an indication of the relative light level striking the photodiode 12. This control voltage $V_C$ is one output voltage of the automatic brightness control apparatus 10 and can be used as an analog output which indicates the relative light level striking the photodiode 12. In the preferred embodiment, the output of operational amplifier 22 was not designed to sink or source much current so any load placed at PIN 3 of DIP 11 must be limited to ±1 ma maximum. The output of operational amplifier 22 on PIN 3 of DIP 11 may be used to control the brightness of a CRT or as an input to an A to D converter from which it can then be stored in memory and be used to control display brightness with software. This would make the unit compatible with the National Semiconductor COPS series of display drivers which will accept display brightness information from a microprocessor.

Figure 3:
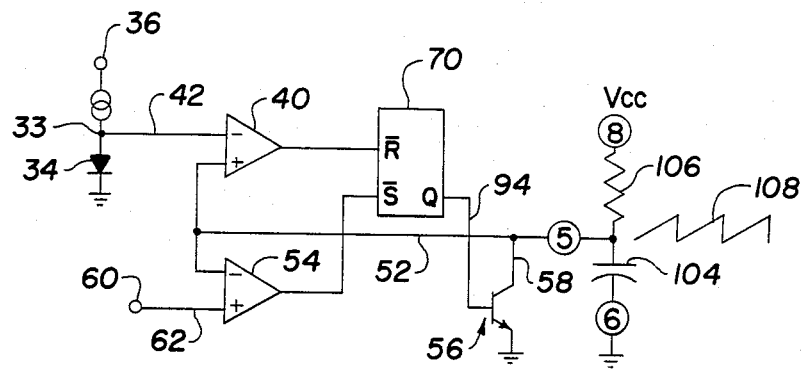
FIG. 3 is a simplified schematic diagram of the ramp oscillator portion of the present invention.

The three basic types of displays used in the instrument panels of automobiles are LED, LCD and vacuum fluorescent. Display brightness of both LED and vacuum fluorescent is affected by fluctuations in power supply voltage. It is desirable that the automatic brightness control apparatus 10 hold the brightness of the display at a constant level which will not be affected by power supply changes. The automatic brightness control apparatus 10 holds the brightness of the display at a constant level by pulse width modulation of its output, on PIN 7 of DIP 11, to the display whose brightness is to be controlled. The development of the pulse width modulated output of the automatic brightness control apparatus 10 starts with a free running ramp oscillator. FIG. 3 discloses a simplified example of the free running ramp oscillator used in the automatic brightness control apparatus 10 and comprises a simple RC circuit with an upper and lower threshold point. The various logic gates of the automatic brightness control apparatus 10 are omitted from FIG. 3 since they are for the purpose of providing the ability of the automatic brightness control apparatus 10 to synchronize with a display driver and will be discussed later. An external capacitor 104 is connected between PINS 5 and 6 of DIP 11 and an external resistor 106 is connected between PINS 5 and 8 of DIP 11 with $V_{CC}$ being applied to PIN 8. Capacitor 104 is charged through resistor 106 toward the value of $V_{CC}$ until its voltage just exceeds $\frac{1}{2} V_{CC}$. At that voltage value, the output of third comparator 54 to $\overline{S}$ input terminal of $\overline{R}\,\overline{S}$ latch 70 goes low because the value of the voltage applied via lead 52 to the negative input terminal exceeds the value of the voltage, which is $\frac{1}{2} V_{CC}$, applied to the positive input terminal of third comparator 54. The low value input to $\overline{S}$ input terminal sets the latch 70 resulting in the Q output of latch 70 going high and driving the base terminal of NPN transistor 56 and placing NPN transistor 56 to the "on" condition. With NPN transistor 56 turned on, capacitor 104 is discharged therethrough until the voltage at PIN 5 goes just below $V_R$, which is approximately 680 mv. At that voltage value, the output of second comparator 40 to the $\overline{R}$ input terminal of $\overline{R}\,\overline{S}$ latch 70 goes low because the value of the voltage applied via lead 52 to the positive input terminal is less than the value of the voltage $V_R$ applied to the negative input terminal of second comparator 40. The low value input to $\overline{R}$ resets the latch 70 resulting in the Q output of latch 70 going low and placing the NPN transistor 56 in the "off" condition. With NPN transistor 56 turned off, capacitor 104 will again be charged through resistor 106 and the process will be repeated with a resulting ramp waveform 108 on PIN 5. The switching of transistor 56 on and off results in the capacitor 104 being charged and discharged. The frequency of this resulting ramp waveform 108 of the free running ramp oscillator can be predicted by the formula $F = 1.44/RC$. In the preferred embodiment, the frequency is 150 Hz.

Figure 4:
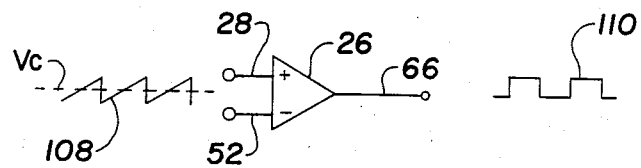
FIG. 4 is a simplified schematic diagram of the pulse width modulated logic output signal of the present invention.

A control voltage $V_C$ which provides an indication of the relative light level striking the photodiode 12 and a ramp frequency from the free running ramp oscillator have both now been obtained. These two signals can be compared with a voltage comparator (first comparator 26) and the resulting output will be a logic signal which is pulse width modulated. This is schematically represented in FIG. 4. The control voltage $V_C$ obtained from the current output of photodiode 12 is the input to the positive input terminal of first comparator 26 via lead 28 while the ramp waveform is the input to the negative input terminal of first comparator 26. The resulting output waveform 110 of the first comparator 26 is pulse width modulated. During the time the value of the waveform 108 is less than the value of the reference voltage input, the output of the first comparator 26 is high. During the time the value of the waveform 108 is greater than the value of the reference voltage input, the output of the first comparator 26 is low. Note that if the power supply voltage, $V_{CC}$, decreases, the peak to peak ramp voltage of waveform 108 will drop and, therefore, the duty cycle of the output will increase. Also, the duty cycle of the output varies proportionally with the ambient light level.

Again with reference to FIG. 1, the logic circuity to synchronize the automatic brightness control apparatus 10 with a display driver includes fourth comparator 44. The trigger pulse is input on PIN 4 of DIP 11 and the output of fourth comparator 44 goes low during the time the trigger pulse is greater than the reference voltage being applied to terminal 48. This low state is provided as an input to NOR gate 74 via lead 78 and to one-shot multivibrator 80 via lead 82. The output of one-shot multivibrator 80 provides a high input to NOR gate 84 via lead 88 for the predetermined duration of the output pulse from one-shot multivibrator 80. During this time, capacitor 104 is charging toward $V_{CC}$ and the output of third comparator 54 is high with this state being input to the other input terminal of NOR gate 74 via lead 76. This causes the output of NOR gate 74 to go low and is the other input to NOR gate 84 via lead 86. The output of NOR gate 84 then goes low and is input to the $\overline{S}$ input of $\overline{R}\,\overline{S}$ latch 70 via lead 90 causing Q to go high and driving the base of transistor 56 and thereby discharging capacitor 104. In order to synchronize with a display driver, it is necessary that the ramp always begins with an incoming sync pulse. This capability is necessary for systems with multiple displays or digits which are multiplexed. In the multiplexed case, the ramp frequency should be at least four times the multiplexing frequency.

When apparatus 10 is used in a system with multiple displays, a particular apparatus 10 is chosen as the master unit. The photodiode 12 (the light level sensor) on each of the other apparatus 10, which are the slave units, is covered such that they cannot function to output a signal indicative of the light level. The output signal on PIN 3 of the designated master unit is fed to all the slave or remote units and input on PIN 1 thereof so all the apparatus 10 have the same duty cycle. In addition, an output signal 110 (which is a pulse train signal) is then not required to be sent throughout the system, where it might cause interference, since only the DC control voltage $V_C$ is sent around the system.

The automatic brightness control apparatus 10 will perform in the asynchronous mode if the trigger input at PIN 4 of DIP 11 is held at $V_{CC}$ or at any voltage level greater than the voltage on terminal 48. With PIN 4 at Vcc, the output of the fourth comparator 44 is low all the time. The output of the fourth comparator is input to NOR gate 74. The other input to NOR gate 74 is high and comes from third comparator 54. The output of NOR gate 74 is low and with two low inputs the output of NOR gate 84 is high. The Q output of latch 70 is low, having been reset the last time capacitor 104 was discharged, thereby allowing capacitor 104 to charge. When the voltage on capacitor 104 just exceeds ½ $V_{CC}$ then the output of third comparator 54 goes low causing the output of NOR gate 74 to go high. This causes the output of NOR gate 84 to go low causing the Q output of latch 70 to go high resulting in the discharge of capacitor 104. When the voltage of capacitor 104 reaches $V_R$ (which is approximately 0.70), latch 70 is reset by the output of second comparator 40 and the process is repeated.

If PIN 4 is continuously grounded then the ramp waveform will stop. With PIN 4 grounded, the output of fourth comparator 44 is always high as an input to NOR gate 74. The output of NOR gate 74 is always low regardless of the level of input from third comparator 54. With the two low inputs, the output of NOR gate 84 is high which causes Q output of latch 70 to stay low causing capacitor 104 to charge until a change occurs on the trigger input of PIN 4; therefore, capacitor 104 will charge to $V_{CC}$.

As shown in FIG. 1, NAND gate 64 has three inputs. $\overline{Q}$ input via lead 92 is low during the time capacitor 104 is discharging and is high during the time capacitor 104 is charging. The input via lead 68 from second comparator 40 is high except for the short period of time when capacitor 104 is changing from discharging to charging. These first two inputs on leads 68 and 92 are needed to hold the output of driver 100 low while capacitor 104 is discharging, so that the output duty cycle can approach zero % in a linear fasion. The input from first comparator 26 via lead 66 comprises a series of pulses whose rising edge is centered about the point of time when capacitor 104 is discharging. The width of the pulse is directly proportional to the level of ambient light measured by photodiode 12. When all inputs to NAND gate 64 are high, the output is low. The amount of time the output of NAND gate 64 is low is, for all practical purposes, directly proportional to the amount of time the output of first comparator 26 is high. The output of NAND gate 64 is input to output driver 100 whose output goes to PIN 7. The output "on time" is the time when the ramp voltage is less than the reference voltage derived from photodiode 12 and the ramp voltage is synchronized with the trigger signal. The output is a totem pole output which will sink 20 ma or source up to 50 ma. As the ambient light level goes up, the width of the output pulses increases (the duty cycle increases) which increases the brightness of the display. As the ambient light level decreases, the opposite occurs and the brightness of the display is decreased.

Figure 5:
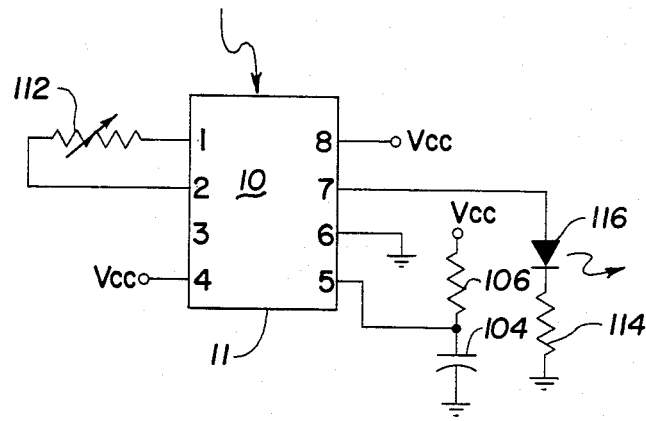
FIG. 5 is a simplified exemplary schematic illustrating one application of the present invention.

With reference to FIG. 5, the invention is disclosed in an application for controlling the brightness of a standard LED. A variable resistor 112 is connected between PINS 1 and 2 which allows the operator to vary and set the light sensitivity level as desired. Resistor 112 is the load resistance of the current amplifier 14 and can range from 25K ohm to 200K ohm. The buffered analog response of the circuit is then available at PIN 3. Resistor 106 is 100K ohm and capacitor 104 is 0.1 microfarad. Resistor 114 in series with LED 116 is 360 ohm. $V_{CC}$ is 12 plus or minus 3 volts. If the automatic brightness control apparatus 10 is used in a battery controlled system and the battery voltage drops, the control apparatus 10 will increase its duty cycle and cause the display it is controlling to maintain a constant light output.

Figure 6:
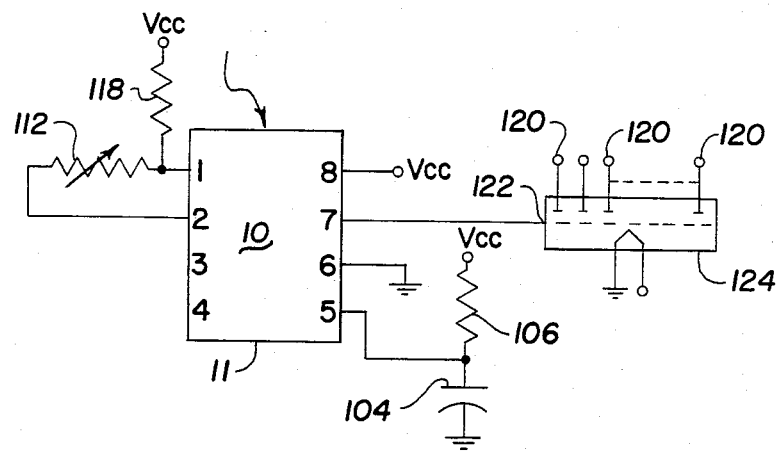
FIG. 6 is a simplified exemplary schematic illustrating another application of the present invention.

With reference to FIG. 6, the invention is disclosed in an application for controlling the brightness of vacuum fluorescent displays. Variable resistor 112 is adjusted for a brightness level that is pleasing to the eye. Resistor 118 is added to keep the display from going completely off when apparatus 10 is in total darkness. The automatic brightness control apparatus 10 is capable of adjusting the display brightness from 0 to 100%. Segments 120 are off with 0 volts applied and are on with +12 v applied. The output of apparatus 10 is applied to grid 122 of the vacuum fluorescent display 124.

It will be appreciated that the present invention provides apparatus for automatically providing real time control of the brightness level of various displays while also providing ambient light compensation. The present invention also compensates for changes in the power supply voltage for the display. Features of the present invention include external sensitivity adjustment, analog and digital output and synchronous or asynchronous modes of operation.

Thus, it is apparent that there has been provided in accordance with this invention, an automatic brightness control apparatus that substantially incorporates the advantages set forth above. Although the present invention has been described in conjunction with specific forms thereof, it is evident that many alternatives, modifications, and variations will be apparent to those skilled in the art in light of the foregoing disclosure. Accordingly, this description is to be construed as illustrative only and is for the purpose of teaching those skilled in the art the manner of carrying out the invention. It is understood that the forms of the invention herewith shown and described are to be taken as the presently preferred embodiments. Various changes may be made in the shape, size and arrangement of parts. For example, equivalent elements may be substituted for those illustrated and described herein, parts may be reversed, and certain features of the invention may be utilized independently of other features of the invention. It will be appreciated that the various modifications, alternatives, variations, etc. may be made without departing from the spirit and scope of the invention as defined in the appended claims.

I claim:

1. Apparatus for receiving voltage from a power supply and for producing a periodic electrical output signal whose average value is proportional to the ambient light level and independent of fluctuations in the power supply voltage, comprising:
    a photosensor circuit for producing an electrical signal proportional to the ambient light level and substantially independent of the power supply voltage;
    a ramp oscillator circuit for producing a periodic electrical signal having a ramp waveform whose amplitude is proportional to the power supply voltage; and an output circuit for comparing the photosensor signal to the ramp signal and producing a periodic output signal whose duty cycle is the portion of time the photosensor signal exceeds the ramp signal.

2. The apparatus of claim 1, wherein the output circuit comprises:
   a latch circuit having a first input and having an output which produces said periodic output signal; and
   a first comparator having a first input connected to receive the photosensor signal, a second input connected to receive the ramp signal, and an output connected to the first input of the latch.

3. The apparatus of claim 2, wherein the output circuit further comprises:
   a second comparator having a first input connected to receive a reference voltage, a second input connected to receive the ramp signal, and an output; wherein the latch further includes a second input connected to the output of the second comparator.

4. The apparatus of claim 3, further comprising a light-emitting display connected to receive power from the periodic output signal, wherein the display produces a light output proportional to the periodic output signal.

5. Apparatus for controlling the brightness of a light-emitting display having a plurality of display elements which are sequentially time multiplexed at a certain frequency, comprising:
   means for driving each display element with a periodic electrical signal;
   means for controlling the duty cycle of the periodic electrical signal to control the brightness of each display element; and
   means for synchronizing the frequency of the periodic signal driving each said display element to a multiple of the frequency at which the display elements are sequentially time multiplexed.

* * * * *